United States Patent [19]
Alfaro

[11] Patent Number: 5,979,728
[45] Date of Patent: Nov. 9, 1999

[54] APPARATUS FOR BREAKING AND SEPARATING DIES FROM A WAFER

[75] Inventor: Rafael C. Alfaro, Carrollton, Tex.

[73] Assignee: Texas Instruments Incorporated, Dallas, Tex.

[21] Appl. No.: 08/927,430

[22] Filed: Sep. 11, 1997

Related U.S. Application Data

[60] Continuation of application No. 08/485,168, Jun. 7, 1995, abandoned, which is a division of application No. 08/367,970, Jan. 3, 1995, Pat. No. 5,710,065.

[51] Int. Cl.$^6$ .............................. B26F 3/00; H01L 21/78
[52] U.S. Cl. ................................ 225/93; 225/2; 225/103; 225/96.5
[58] Field of Search ............................. 225/96, 103, 93, 225/2, 96.5

[56] References Cited

U.S. PATENT DOCUMENTS

| | | | |
|---|---|---|---|
| 3,448,510 | 6/1969 | Bippus | 225/2 |
| 3,493,155 | 2/1970 | Litant et al. | 225/2 |
| 3,562,057 | 2/1971 | McAlister et al. | 225/93 X |
| 3,562,058 | 2/1971 | Boyd | 225/93 X |
| 3,565,306 | 2/1971 | St. Louis | 225/93 X |
| 3,727,282 | 4/1973 | Neary | 225/2 |
| 3,730,410 | 5/1973 | Altschuler | 225/2 |
| 3,766,638 | 10/1973 | Moore | 225/2 |
| 3,790,051 | 2/1974 | Moore | 225/93 X |
| 3,920,168 | 11/1975 | Regan et al. | 225/96.5 X |
| 4,140,260 | 2/1979 | Gantley | 225/93 |
| 4,775,085 | 10/1988 | Ishizuka et al. | 225/93 X |
| 5,104,023 | 4/1992 | Nishiguchi et al. | 225/103 |
| 5,310,104 | 5/1994 | Zaidel | 225/2 |

FOREIGN PATENT DOCUMENTS

| | | |
|---|---|---|
| 63-272510 | 10/1988 | Japan . |
| 03177051 | 1/1991 | Japan . |
| 1 211 638 | 11/1970 | United Kingdom . |

*Primary Examiner*—M. Rachuba
*Assistant Examiner*—Boyer Ashley
*Attorney, Agent, or Firm*—Charles A. Brill; Frederick J. Telecky, Jr.; Richard L. Donaldson

[57] ABSTRACT

An apparatus for breaking a wafer into individual devices. An anvil 100 is pressed against a flexible membrane 304 on which a wafer 300 is attached. A vacuum is applied to the anvil 100 which allows the flexible membrane 304 and the wafer 300 to be pressed against the face of the anvil 100. As the flexible membrane 304 is deformed against the anvil 100, the wafer 300 breaks into individual devices 302. Dicing debris that is created when the wafer 300 is broken falls into a base fixture 408 so that the debris does not contact and damage the devices 302.

15 Claims, 4 Drawing Sheets

APPARATUS FOR BREAKING AND SEPARATING DIES FROM A WAFER

This application is a Continuation of application Ser. No. 08/485,168 filed on Jun. 7, 1995, now abandoned, which is a divisional of Ser. No. 08/367,970, filed on Jan. 3, 1995 now U.S. Pat. No. 5,710,065.

TECHNICAL FIELD OF THE INVENTION

This invention relates to the field of integrated circuit processing, more particularly to micromechanical device fabrication, including the fabrication of digital micromirror devices

BACKGROUND OF THE INVENTION

The fabrication of integrated circuits is most cost effective when many circuits, or devices, are simultaneously fabricated on a single semiconductor wafer. This form of batch processing, or wafer processing, allows the cost of each step of the fabrication process to be spread among many devices and reduces the handling that would be required to process each device individually. A typical process flow includes many lithography, deposition, doping, etching, and testing steps. The lithography and testing steps require that the processing equipment be precisely aligned to each device in order to accurately fabricate or probe the very small features of the device. Wafer-level processing allows the processing equipment to align itself to each device on the wafer by aligning to the wafer one time. After the devices on a wafer are fabricated, the devices are tested and the wafer is separated, typically by sawing or breaking the wafer. The individual devices are then packaged, completing the fabrication process.

Dicing debris, comprised of wafer particles and dust, is created when the devices are separated from a wafer. This dicing debris is washed from the surface of the device prior to bonding the device to the package. Micro electronic mechanical systems (MEMS), or micromechanical devices, often have structures that are too fragile to survive exposure to some of the standard device fabrication steps such as device separation and cleanup. The fragile nature of some MEMS requires that the standard IC process steps be reordered to avoid damaging the completed devices. For example, digital micromirror devices and some accelerometers, as described in commonly assigned U.S. Pat. No. 5,061,049 and U.S. patent Ser. No. 07/883,616, have very small structures suspended over electrodes formed on the surface of a silicon substrate. Once these structures are formed and a sacrificial material is etched from the gap between the structure and the electrode, the devices are very fragile. The devices cannot be exposed to liquids, such as would occur during wafer cleanup steps, without risking the destruction of the suspended structures. Therefore, the devices must be separated and the dicing debris washed away before etching the sacrificial material from underneath the mirror.

Separating the wafer before the devices are completed results in extensive device handling during the remaining device fabrication steps such as passivation and device testing. Performing the remaining steps, especially device testing, on individual devices greatly increases the necessary handling and therefore the cost of the completed devices. A need exists for a method and apparatus for breaking and separating semiconductor wafers which eliminates the need to clean the dicing debris. Such a process and apparatus would allow debris sensitive devices to be completely manufactured in wafer form, eliminating the need for costly device level processing.

SUMMARY OF THE INVENTION

A method and apparatus for separating a wafer into individual wafer portions, wherein the wafer is mounted on a flexible membrane and deformed with an anvil so that the individual wafer portions are physically or structurally separated from the wafer. As the anvil is deforming the flexible membrane and breaking the wafer, the flexible membrane is stretched to spatially separate the wafer portions. A base fixture holds the tape frame during the breaking operation. The base fixture may be purged with ionized nitrogen to prevent damage caused by electrostatic discharge.

The disclosed method allows the wafers to be broken in both the x and y directions, and spatially separated from each other, in one operation. The spatial separation allows dicing debris created when the wafer is broken to fall away from the wafer so that the debris will not damage the devices.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
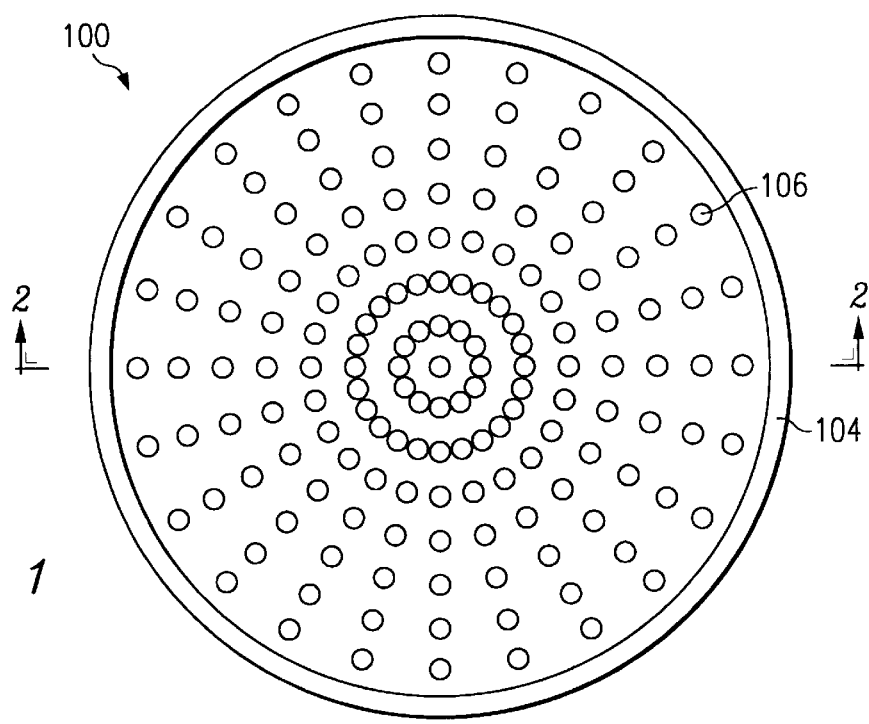
FIG. 1 is a plan view according to one embodiment of the present invention of an anvil used to break semiconductor wafers.
Figure 2:
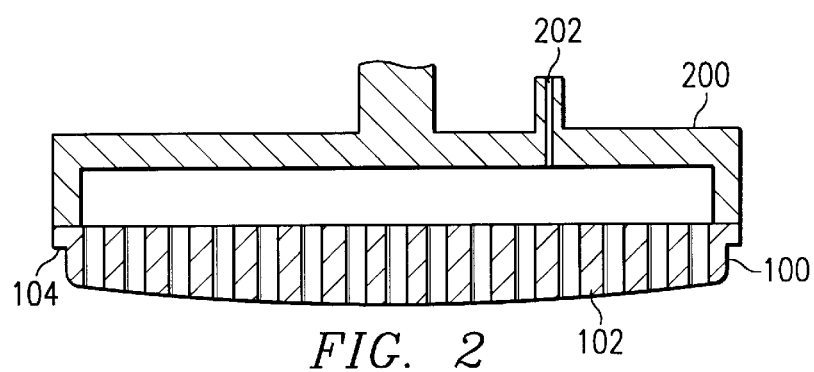
FIG. 2 is a cross-sectional view of the anvil of FIG. 1 showing a vacuum cover applied to the backside of the anvil.
Figure 3:
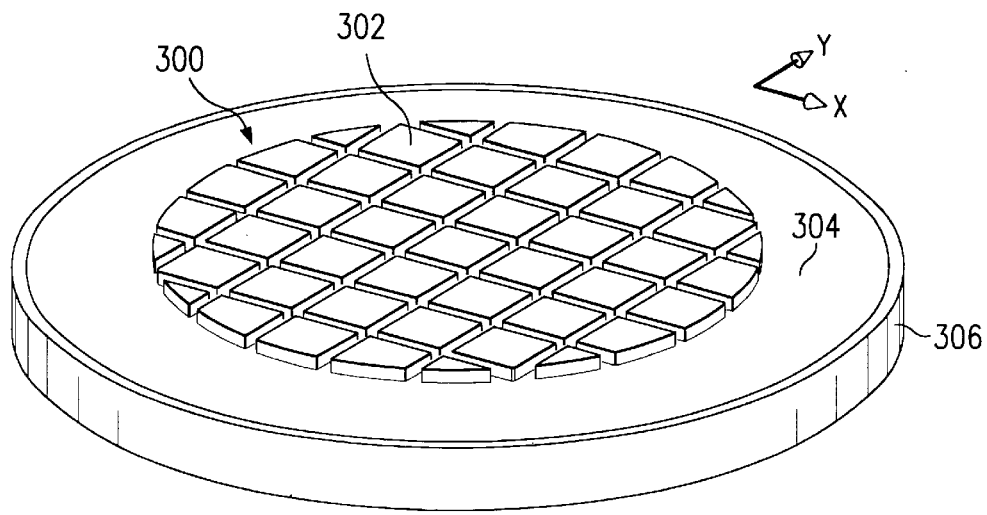
FIG. 3 is a perspective view of a semiconductor wafer having partially sawn streets attached to a piece of dicing tape held by a tape frame.

The disclosed invention provides a method and apparatus for breaking and separating devices from a wafer in one operation while simultaneously controlling the dicing debris generated by the wafer separation process. A dome shaped anvil 100, as shown in FIGS. 1 and 2, is used to break a wafer 300, shown in FIG. 3, by deforming the wafer 300. The wafer 300 is comprised of many devices 302, or dies, and is held on a flexible membrane, typically a piece of dicing tape 304, which in turn is held in a tape frame 306. The face of the anvil 102 may have either a single radius, or may have a more complex shape as shown in FIGS. 1 and 2. The anvil 100 shown has a center face section, 5 inches across, with a 36 inch radius, and an outer face section with a 24 inch radius. The radii of the two sections are chosen based on the diameter of the wafer 300 and the size of the devices 302 on the wafer 300. The larger the devices 302 on the wafer 300 the larger the radius of curvature of the face the anvil 100.

The edge of the anvil 100 includes a lip 104 to allow the anvil 100 to engage the tape frame 306. Orifices, or holes 106, in the anvil 100 allow a vacuum applied to the backside of the anvil 100, forcing the dicing tape 304 against the anvil 100 and facilitating breaking the wafer 300. The anvil 100 is mounted on a vacuum cover 200, as shown in FIG. 2, to allow a vacuum to be applied to the backside of the anvil 100 through cover vacuum port 202.

Figure 4:
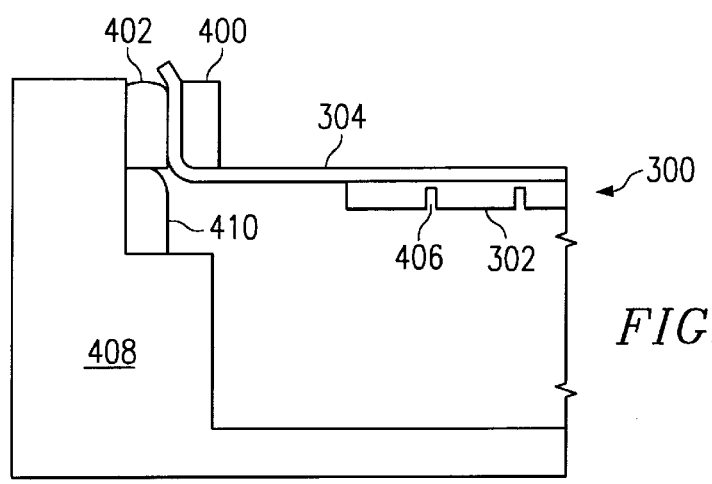
FIG. 4 is a cross-sectional view of the wafer, dicing tape, and tape frame of FIG. 3 in a base fixture.
Figure 5A:
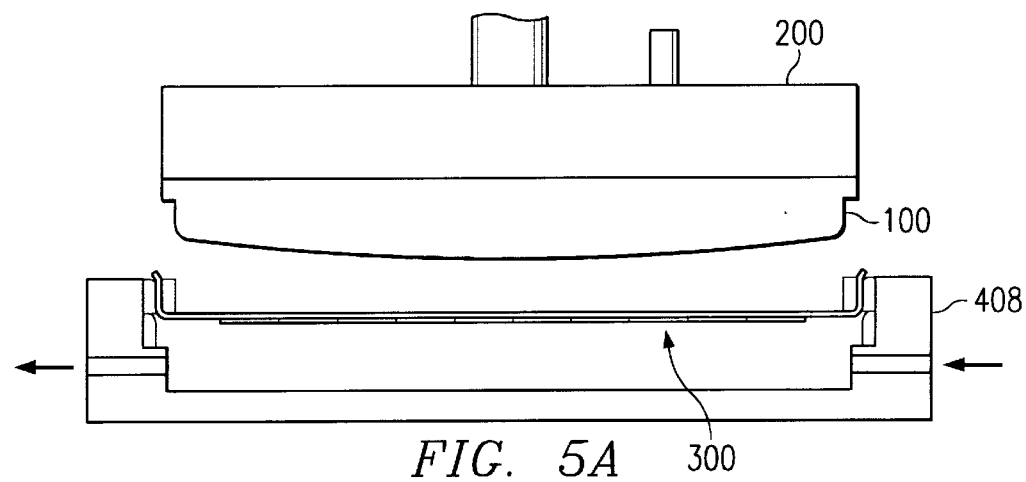
FIGS. 5A–5E are a sequence of cross-sectional views showing an anvil breaking and separating a the wafer attached to dicing tape and tape frame of FIG. 4.
Figure 5B:
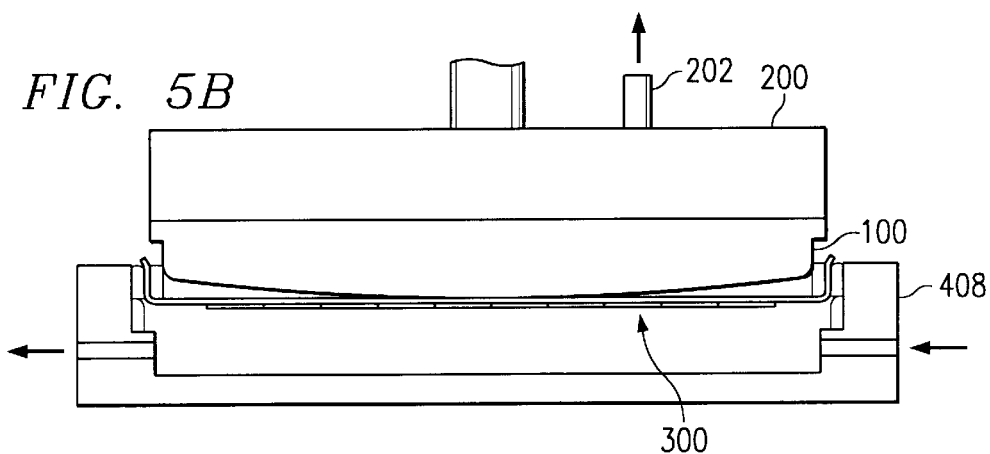
Figure 5C:
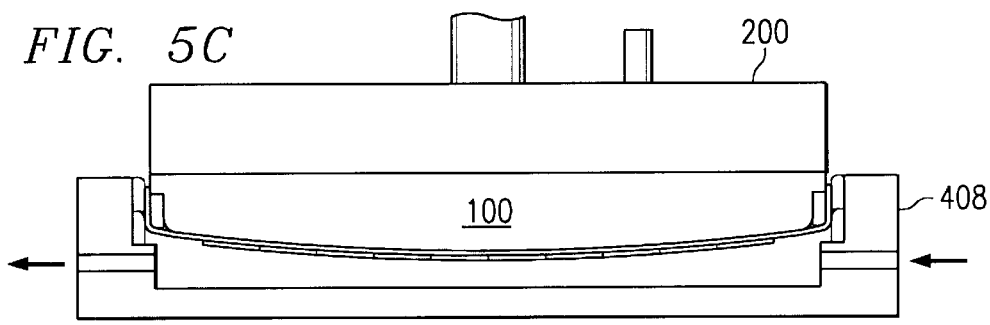
Figure 5D:
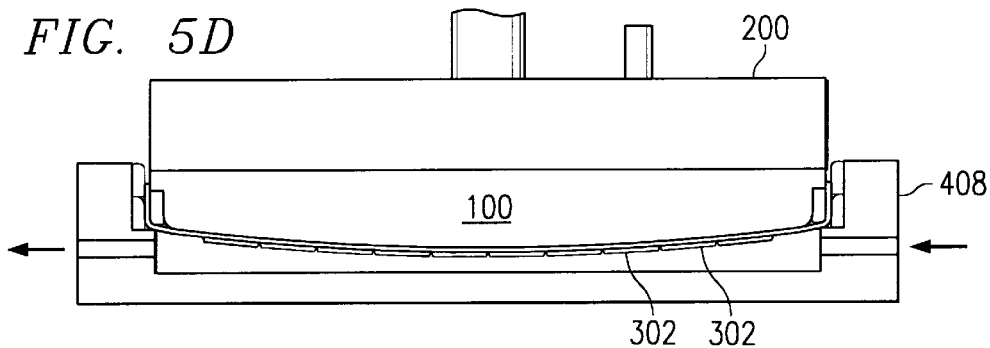
Figure 5E:
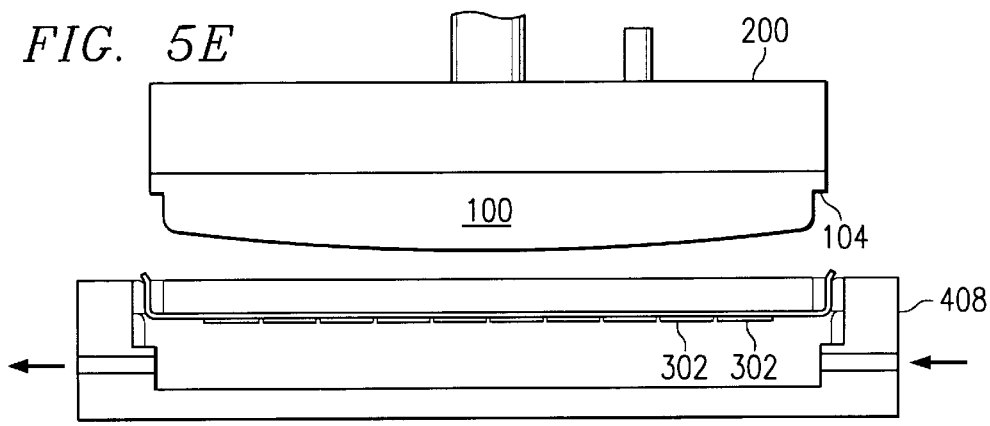

The tape frame 306 is typically comprised of two separate rings, an inner ring 400 and an outer ring 402, as shown in FIG. 4. The dicing tape 304 is held between the two rings 400, 402. The wafer 300 has typically been weakened between the devices 302 by either scribing the areas between the devices 302, or by partially sawing between the devices 302 to leave saw kerfs 406. The tape frame 306 may also be a single piece frame, but the dicing tape 304 typically does not remain taut in a single piece frame after being stretched by the anvil 100.

Before breaking a wafer 300, the wafer 300, tape 304, and frame 306 are placed on a base fixture 408. The wafer 300 is typically placed on the base fixture 408 face down to allow the anvil 100 to press against the dicing tape 304 on the backside of the wafer 300. The anvil 100 could press against the wafer 300 itself, but damage to the surface may occur and the dicing debris would be trapped between the anvil 100 and the separated wafer. A third ring 410, typically identical to the outer ring 402, is held between the base fixture 408 and the tape frame 306 comprised of the inner and outer rings 400, 402.

The base fixture 408 is purged with low pressure ionized nitrogen, and evacuated. The ionized nitrogen prevents electrostatic discharges from damaging the devices 302. Because the wafer is upside down, the dicing debris created when the wafer 300 is broken enters the base fixture 408 where the vacuum applied to the base fixture 408 helps to remove the dicing debris from the base fixture 408.

As the anvil 100 is pressed against the dicing tape 304, the wafer 300 will be deformed until it breaks in both the x and y directions, thereby physically separating the wafer 300 into individual devices 302. The separated devices 302 are also spatially separated from each other by the operation of a stretching means. This means for stretching the flexible membrane 304 includes the inner and outer ring 400, 402, the third ring 410, and the lip 104 on the anvil 100.

The operation of the device is shown in FIGS. 5A through 5E. The wafer 300 is placed upside down in the base fixture 408, which is then purged and evacuated. The anvil 100 is brought into contact with the backside of the dicing tape 304, and the vacuum cover 200 is evacuated. The vacuum causes the dicing tape 304 to be pressed against the anvil 100, breaking the wafer 300. After the wafer 300 is broken, or as the wafer 300 is breaking, the anvil 100 is pressed against the dicing tape 304. The vacuum is typically removed from the vacuum cover 200 after the wafer 300 is broken to allow the dicing tape 304 to stretch over the anvil 100. The anvil lip 104 engages the inner ring 400 of the tape frame 306 and pushes the inner ring 400 toward the base fixture 408, causing the third ring 410 to slide the outer ring 402 off of the inner ring 400. As the outer ring 402 slides off of the inner ring 400 it stretches the dicing tape 304 which spatially separates the devices 302 from each other. The distance the anvil 100 travels after breaking the wafer 300 determines the spatial separation of the devices 302.

Figure 6A:
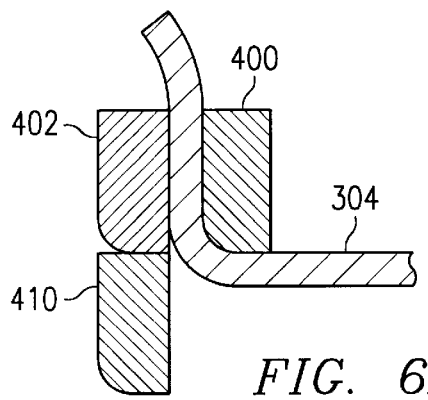
FIGS. 6A–6B are a sequence of cross-sectional views showing one embodiment of a stretching means.
Figure 6B:
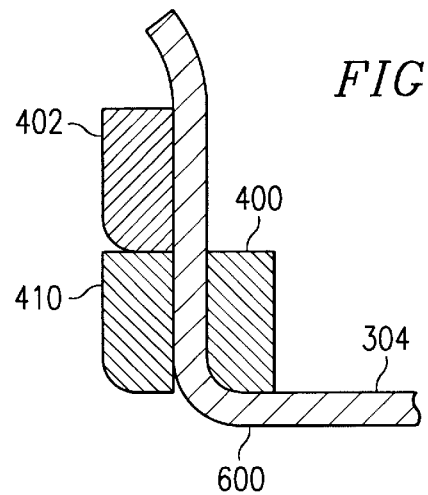

FIGS. 6A and 6B show the embodiment of the stretching means discussed above. The dicing tape 304 is initially held between the inner ring 400 and the outer ring 402. The anvil lip 104 presses the inner ring 400 downward until the dicing tape is help between the inner ring 400 and the third ring 410. Because the dicing tape has adhesive on the bottom surface 600, which contacts the outer ring 402, the dicing tape 304 does not slip relative to the outer ring 402, and therefore is stretched by the action of the anvil 100 and the rings 400, 402, 410.

Figure 7A:
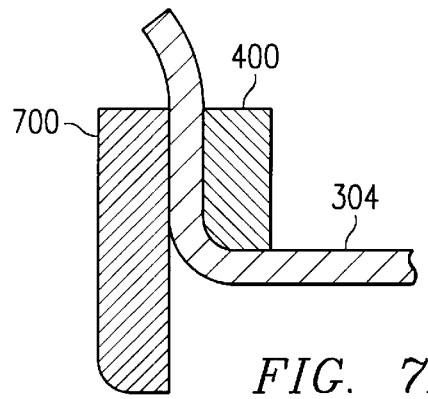
FIGS. 7A–7B are a sequence of cross-sectional views showing another embodiment of a stretching means.
Figure 7B:
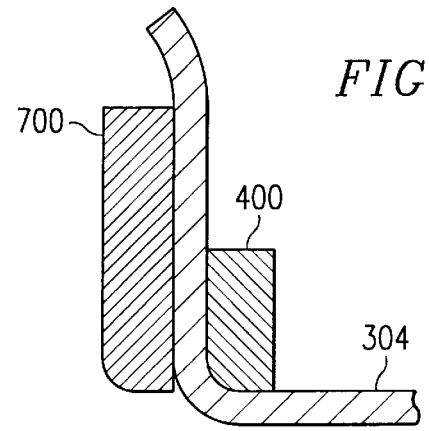

FIGS. 7A and 7B show one alternative to a stretching means using a third ring 410. In FIGS. 7A and 7B, the outer ring 700 is larger than the outer ring 402 of FIGS. 6A and 6B. This allows the inner ring 400 to slide from a top portion of the outer ring 700, to a bottom portion of the outer ring 700, while stretching the dicing tape 304.

Figure 8A:
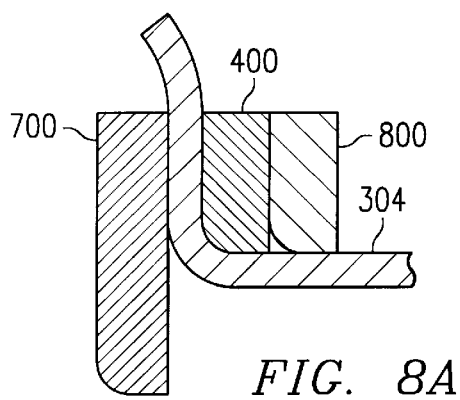
FIGS. 8A–8B are a sequence of cross-sectional views showing another embodiment of a stretching means.
Figure 8B:
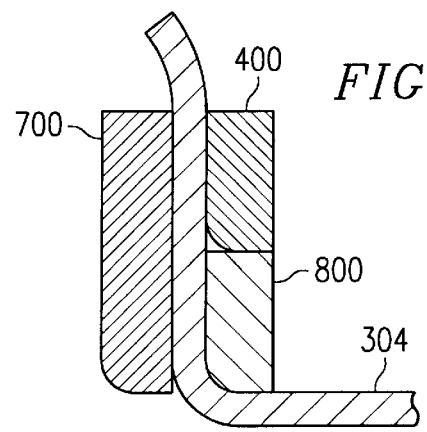

FIGS. 8A and 8B show another alternative stretching means. The enlarged outer ring 700 is used, as in FIGS. 7A and 7B, but instead of sliding the inner ring 400 relative to the outer ring 700, an inner split ring 800 is used. The split ring 800 is initially compressed and held inside the inner ring 400. The anvil lip 104 engages the split ring 800 instead of the inner ring 400 and presses the split ring 800 downward past the inner ring 400. After the split ring 800 clears the inner ring 400, the split ring 800 expands against the outer ring 700, stretching the dicing tape 304. Many alternate stretching means may be used to either cause the dicing tape 304 to expand, or to keep the dicing tape 304 taut after the dicing tape 304 is stretched by the anvil 100.

Thus, although there has been described to this point a particular embodiment for an apparatus for breaking and separating wafers and a method thereof, it is not intended that such specific references be considered as limitations upon the scope of this invention except insofar as set forth in the following claims. Furthermore, having described the invention in connection with certain specific embodiments thereof, it is to be understood that further modifications may now suggest themselves to those skilled in the art. It is intended to cover all such modifications as fall within the scope of the appended claims.

What is claimed is:

1. An apparatus for separating wafers into devices comprising:

a convex anvil having a lip; and a tape frame comprising an outer ring and an inner ring concentric with said outer ring, said outer ring and said inner ring for holding a flexible membrane therebetween, said flexible membrane for holding a wafer attached to one side of said flexible membrane, said inner ring occupying a first position relative to said outer ring and operable to move through an inner region encircled by said outer ring along a first axis;

said anvil operable to deform said flexible membrane in response to relative motion along said first axis between said anvil and said flexible membrane, said deformation breaking said wafer into said devices, and said lip operable to engage said inner ring and transfer said inner ring to a second position relative to said outer ring such that said flexible membrane is maintained in a stretched state relative to said flexible membrane's pre-deformation state thereby spatially separating said devices.

2. The apparatus of claim 1, wherein said anvil is a convex dome attached to a vacuum cover.

3. The apparatus of claim 1, said lip operable to press said inner ring into a second outer ring such that said flexible membrane is between said second outer ring and said inner ring.

4. The apparatus of claim 1, said inner ring comprising an inner split ring, and said apparatus further comprising a third ring between said inner split and said outer ring when said inner split ring is in said first position, said lip on said anvil for press said inner split ring out of said third ring so that said inner split ring expands and presses said flexible membrane against a second portion of said outer ring.

5. The apparatus of claim 1, further comprising a base fixture, wherein said tape frame is supported by and above said base fixture, said tape frame oriented such that said wafer is beneath said flexible membrane, thereby allowing debris created by breakage of said wafer to fall into base fixture.

6. The apparatus of claim 1, said convex anvil having at least two vacuum orifices, further comprising:

a vacuum cover attached to said convex anvil for allowing a vacuum to be applied to said at least two vacuum orifices wherein said vacuum applied to said at least two vacuum orifices operates to draw said flexible membrane against said convex anvil.

7. The apparatus of claim 6, said flexible membrane between said inner ring and a first portion of said outer ring, said lip for pressing said inner ring into a second portion of said outer ring, thereby stretching said flexible membrane.

8. The apparatus of claim 6, said tape frame comprising an inner split ring, and a third ring between said inner split ring and said outer ring when said inner split ring is in a first position, with said flexible membrane between said third ring and a first portion of said outer ring, said anvil lip for engaging said inner split ring, and for pressing said inner split ring out of said third ring such that it expands against said outer ring, thereby stretching said flexible membrane.

9. The apparatus of claim 6, further comprising a base fixture containing ionized nitrogen and supporting said tape frame.

10. An apparatus for breaking a wafer into individual devices, the apparatus comprising:

a convex anvil having at least two vacuum orifices and a lip;

a vacuum cover attached to the convex anvil for allowing a vacuum to be applied to said at least two vacuum orifices;

a tape frame comprising an inner ring and a larger diameter outer ring radially surrounding said inner ring, said tape frame operable to hold a flexible membrane between said rings and in alignment with said convex anvil; and said convex anvil operable to deform said flexible membrane in response to relative motion between said convex anvil and said flexible membrane, said lip operable to engage said inner ring and to transfer said inner ring from a first position relative to said outer ring to a second position relative to said outer ring.

11. The apparatus of claim 10, said flexible membrane held between said inner ring and a corresponding adjacent first portion of said outer ring, said lip for moving said inner ring relative to said outer ring such that said flexible membrane is held between said inner ring and a then-corresponding adjacent second portion of said outer ring, thereby stretching said flexible membrane.

12. The apparatus of claim 10, said inner ring comprising an inner split ring, said apparatus further comprising a third ring between said inner split ring and said outer ring, said anvil lip for engaging said inner split ring, and for pressing said inner split ring out of said third ring such that it expands against said outer ring, thereby stretching said flexible membrane.

13. The apparatus of claim 10, said apparatus further comprising a third ring, said anvil lip for engaging said inner ring, and for pressing said inner ring out of said outer ring and into said third ring, thereby stretching said flexible membrane.

14. The apparatus of claim 10, further comprising a base fixture containing ionized nitrogen and supporting said tape frame.

15. The apparatus of claim 10, further comprising a wafer attached to a first side of said flexible membrane, said anvil contacting a second side of said flexible membrane opposite said first side.

* * * * *